United States Patent
Arai

[11] Patent Number: 6,166,488
[45] Date of Patent: Dec. 26, 2000

[54] ORGANIC ELECTROLUMINESCENT DEVICE

[75] Inventor: Michio Arai, Tokyo, Japan

[73] Assignee: TDK Corporation, Tokyo, Japan

[21] Appl. No.: 09/241,057

[22] Filed: Feb. 1, 1999

[30] Foreign Application Priority Data

Dec. 29, 1998 [JP] Japan .................................. 10-377477
Feb. 1, 1999 [JP] Japan .................................. 11-024022

[51] Int. Cl.$^7$ ...................................................... H01J 1/62
[52] U.S. Cl. ............................................ 313/504; 313/503
[58] Field of Search ................................. 313/498, 501, 313/503, 504, 506, 509

[56] References Cited

U.S. PATENT DOCUMENTS 5,952,779 9/1999 Arai et al. ................................. 313/504
5,969,474 10/1999 Arai ......................................... 313/504
5,981,092 11/1999 Arai et al. .

FOREIGN PATENT DOCUMENTS 0 740 489   10/1996   European Pat. Off. .
5-3080      1/1993    Japan .
9-17574     1/1997    Japan .
9-260062    3/1997    Japan .
WO 97/42666 11/1997   WIPO .

OTHER PUBLICATIONS

Patent Abstracts of Japan, vol. 1998, No. 02, Jan. 30 1998 (Jan. 30 1998)–& JP 09 260062 A (TDK CORP), Oct. 3 1997 (Oct. 3 1997) Abstract& us 5 981 092 A (Michio Arai et al) Nov. 9 1999 (Sep. 11 19999).
WO 97 42666 A (Pichler Karl; Cambridge Display Tech (GB)) Nov. 13 1997 (Nov. 13 1997) Claims.

Primary Examiner—Frank G. Font
Assistant Examiner—Andrew H. Lee

Attorney, Agent, or Firm—Oblon, Spivak, McClelland, Maier & Neustadt, P.C.

[57] ABSTRACT

An object of the invention is to achieve an organic EL device which is resistant to a deterioration of an inorganic-organic interface, has performance equivalent or superior to that of a prior art device comprising hole and electron injecting and transporting layers using an organic substance, possesses an extended life, weather resistance and high stability, and is inexpensive. This object is accomplished by the provision of an organic EL device which comprises a substrate, a hole injecting electrode and a cathode formed on the substrate, and an organic substance-containing light emitting layer located at least between these electrodes, wherein an inorganic insulating electron injecting and transporting layer is located between the light emitting layer and the cathode, and an inorganic insulating hole injecting and transporting layer is located between the light emitting layer and the hole injecting electrode. The inorganic insulating electron injecting and transporting layer comprises as a main component one or two or more oxides selected from the group consisting of strontium oxide, magnesium oxide, calcium oxide, lithium oxide, rubidium oxide, potassium oxide, sodium oxide and cesium oxide, and the inorganic insulating hole injecting and transporting layer comprises as a main component an oxide of silicon and/or an oxide of germanium. The main component has an average composition represented by $$(Si_{1-x}Ge_x)O_y$$

where $0 \leq x \leq 1$, and $1.7 \leq y \leq 1.99$. The light emitting layer comprises a layer made up of a host substance on a side thereof contiguous to the inorganic insulating electron injecting and transporting layer and/or the inorganic insulating hole injecting and transporting layer. A layer containing a dopant in addition to the host substance is located on the side of the light emitting layer that faces away from the layer made up of the host substance or between them.

8 Claims, 2 Drawing Sheets

ORGANIC ELECTROLUMINESCENT DEVICE

BACKGROUND OF THE INVENTION

1. Technical Art

The present invention relates generally to an organic EL (electroluminescent) device, and more specifically to an inorganic/organic junction structure used for a device comprising an organic compound thin film which emits light at an applied electric field.

2. Background Art

In general, an organic EL device is basically built up of an ITO or other transparent electrode formed on a glass substrate, an organic amine base hole transporting layer laminated on the transparent electrode, an organic light emitting layer formed of a material having electronic conductivity and giving out strong light emission, for instance, an Alq$^3$ material, and an electrode provided on the organic light emitting layer and formed of a material having a low work function, for instance, an MgAg material.

As reported so far in the art, the device has a structure wherein one or plural organic compound layers are interleaved between a hole injecting electrode and an electron injecting electrode. The organic compound layer has a double- or triple-layer structure.

Examples of the double-layer structure are a structure wherein a hole transporting layer and a light emitting layer are formed between the hole injecting electrode and the electron injecting electrode, and a structure wherein a light emitting layer and an electron transporting layer are formed between the hole injecting electrode and the electron injecting electrode. In an exemplary triple-layer structure, a hole transporting layer, a light emitting layer and an electron transporting layer are provided between the hole injecting electrode and the electron injecting electrode. A single-layer structure wherein a single layer has all functions, too, is reported in conjunction with a polymer or mixture system.

Typical structures of the organic EL device are shown in FIGS. 3 and 4.

In FIG. 3, a hole transporting layer 14 and a light emitting layer 15, each made of an organic compound, are formed between a hole injecting electrode 12 provided on a substrate 11 and an electron injecting electrode 13. In this case, the light emitting layer 15 also functions as an electron transporting layer.

In FIG. 4, a hole transporting layer 14, a light emitting layer 15 and an electron transporting layer 16, each made of an organic compound, are formed between a hole injecting electrode 12 provided on a substrate 11 and an electron injecting electrode 13.

A problem common to these organic EL devices is reliability. In principle, an organic EL device comprises a hole injecting electrode and an electron injecting electrode and requires an organic layer for efficient injection and transportation of holes and electrons from between these electrodes. However, these materials are sensitive to damages during device fabrication, and offer a problem in conjunction with an affinity for electrodes. For the electron injecting electrode for injection of electrons, it is required to use a metal having a low work function. For this reason, there is no choice but to use MgAg, AlLi, etc. for materials. However, these materials are susceptible to oxidation and lack stability, and so are a grave factor responsible for a reduction in the service life of the organic EL device and a reliability problem. A further problem is that the deterioration of an organic thin film is much severer than that of an LED (light emitting diode), and an LD (laser diode).

Most organic materials are relatively expensive. Otherwise stated, there is a great merit in providing low-cost organic EL device products by substituting a partial constitution film with an inexpensive inorganic material.

To provide a solution to such problems, methods of taking advantage of merits of both an organic material and an inorganic material have been envisaged. That is, an organic/inorganic semiconductor junction wherein an organic hole transporting layer is substituted by an inorganic p-type semiconductor has been contemplated. Such contemplation has been investigated in Japanese Patent No. 2636341, and JP-A's 2-139893, 2-207488 and 6-119973. However, it is still impossible to obtain an organic EL device superior to prior art organic ELs in terms of emission performance and basic device reliability.

With these in mind, the inventors have filed Japanese Patent Nos. 10-303350 and 10-350762 to come up with an inorganic insulating electron injecting and transporting layer and an inorganic insulating hole injecting and transporting layer, each using an oxide. The inventors have then found that a device having satisfactory performance and a long service life can be achieved by using these layers.

Even when the aforesaid inorganic insulating electron, and hole injecting and transporting layers are used, however, the deterioration of an organic layer (a light emitting layer) often occurs at the interface between these inorganic layers and the organic layer, and so renders it difficult to maintain device life over an extended period of time.

SUMMARY OF THE INVENTION

An object of the present invention is to achieve an organic EL device which is resistant to a deterioration of an inorganic-organic interface, has performance equivalent or superior to that of a prior art device comprising hole and electron injecting and transporting layers using an organic substance, possesses an extended life, weather resistance and high stability, and is inexpensive.

The above object is accomplished by the inventions as defined below.

(1) An organic EL device comprising a substrate, a hole injecting electrode and a cathode formed on said substrate, and an organic substance-containing light emitting layer located at least between said electrodes, wherein:

an inorganic insulating electron injecting and transporting layer is located between said light emitting layer and said cathode, an inorganic insulating hole injecting and transporting layer is located between said light emitting layer and said hole injecting electrode, said inorganic insulating electron injecting and transporting layer comprises as a main component one or two or more oxides selected from the group consisting of strontium oxide, magnesium oxide, calcium oxide, lithium oxide, rubidium oxide, potassium oxide, sodium oxide and cesium oxide, said inorganic insulating hole injecting and transporting layer comprises as a main component an oxide of silicon and/or an oxide of germanium, said main component having an average composition represented by

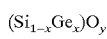

where $0 \leq x \leq 1$, and $1.7 \leq y \leq 1.99$, said light emitting layer comprises a layer made up of a host substance on a side thereof contiguous to said inorganic insulating electron injecting and transporting layer and/or said inorganic insulating hole injecting and transporting layer, and at least a part of said layer made up of said host substance comprises a layer containing a dopant in addition to said host substance.

(2) The organic EL device according to (1), wherein said light emitting layer has a thickness given by a thickness of said layer made up of said host substance that is 5 to 50 nm and a thickness of said dopant-containing layer that is 5 to 100 nm.

(3) The organic EL device according to (1), wherein said inorganic insulating hole injecting and transporting layer further comprises as a stabilizer silicon oxide and/or germanium oxide.

(4) The organic EL device according to (1), wherein said cathode is formed of one or two or more metal elements selected from the group consisting of Al, Ag, In, Ti, Cu, Au, Mo, W, Pt, Pd, and Ni.

(5) The organic EL device according to (1), wherein said inorganic insulating hole injecting layer contains at least one of Cu, Fe, Ni, Ru, Sn, and Au in an amount of up to 10 at %.

(6) The organic EL device according to (2), wherein in said inorganic insulating electron injecting and transporting layer, the ratio of each constituent to all components is:

80 to 99 mol % for said main component, and 1 to 20 mol % for said stabilizer.

(7) The organic EL device according to (1), wherein said inorganic insulating electron injecting and transporting layer has a thickness of 0.1 to 2 nm.

(8) The organic EL device according to (1), wherein said inorganic insulating hole injecting and transporting layer has a thickness of 0.1 to 5 nm.

DETAILED EXPLANATION OF THE PREFERRED EMBODIMENTS

Figure 1:
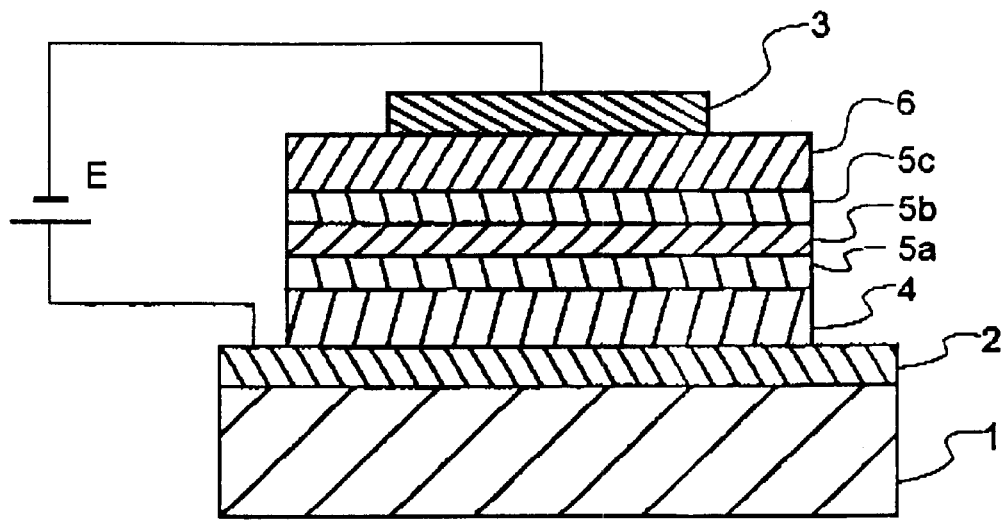
FIG. 1 is a sectional schematic of one embodiment of the organic EL device according to the invention.

The organic EL device of the invention comprises a substrate, a hole injecting electrode and a cathode formed on said substrate, and an organic substance-containing light emitting layer located at least between said electrodes, wherein an inorganic insulating electron injecting and transporting layer is located between said light emitting layer and said cathode, and an inorganic insulating hole injecting and transporting layer is located between said light emitting layer and said hole injecting electrode. The inorganic insulating electron injecting and transporting layer comprises as a main component one or two or more oxides selected from the group consisting of strontium oxide, magnesium oxide, calcium oxide, lithium oxide, rubidium oxide, potassium oxide, sodium oxide and cesium oxide, and the inorganic insulating hole injecting and transporting layer comprises as a main component an oxide of silicon and/or an oxide of germanium, said main component having an average composition represented by $$(Si_{1-x}Ge_x)O_y$$

where $0 \leq x \leq 1$, and $1.7 \leq y \leq 1.99$. The light emitting layer comprises a layer made up of a host substance on a side thereof contiguous to said inorganic insulating electron injecting and transporting layer and/or said inorganic insulating hole injecting and transporting layer, at least a part of said layer made up of said host substance comprising a layer containing a dopant in addition to said host substance.

The layer formed of the host substance is located on a portion of the organic light emitting layer contiguous to the inorganic insulating electron injecting and transporting layer and/or the inorganic insulating hole injecting and transporting layer, and comprises a layer containing the host substance and dopant. It is thus possible to reduce electrical damage to the dopant-containing layer providing an emission center during driving and so increase the life of the device.

The light emitting layer has a double- or three-layer structure, and the dopant-containing layer providing an emission center is formed as one layer of the double-layer structure or an intermediate layer of the three-layer structure, so that the emission center can be located at an optically optimized position. The dopant-containing layer providing an emission center is located on either the side of the inorganic insulating electron injecting and transporting layer or the side of the inorganic insulating hole injecting and transporting layer, or is located at an arbitrary position between the host substance-containing layers. When the dopant-containing layer is located on either the side of the inorganic insulating electron injecting and transporting layer or the side of the inorganic insulating hole injecting and transporting layer, it should preferably be located on the side less susceptible to generation of a leakage current. Usually in this case, the host substance-containing layer is positioned on the side on which the organic layer is susceptible to deterioration or damage at the interface. Usually, the host substance-containing layer contains the host substance alone.

If the light emitting layer is located between the inorganic insulating electron injecting and transporting layer made up of an inorganic material and the inorganic insulating hole injecting and transporting layer again made up of an insulating material, it is then possible to obtain an organic EL device having both the merits of the inorganic material and the merits of the organic material. That is, device fabrication can be facilitated because physical properties are stable at the interfaces between the light emitting layer and the electron injecting layer, and the light emitting layer and the hole injecting and transporting layer. In addition, the thus fabricated device has a luminance equivalent to or higher than that of a prior art device comprising an organic hole injecting layer and an organic electron injecting layer, and is improved in heat resistance and weather resistance over the prior art device, so that the service life of the device can be improved while the occurrence of leakage currents or dark spots is reduced. Device fabrication is also facilitated because inexpensive and easily available inorganic materials are used rather than relatively expensive organic materials, so that device fabrication costs can be cut down.

The light emitting layer is located contiguous to each inorganic layer, and is formed of at least a host substance comprising one or two or more organic compounds taking part in a light emission function. The light emitting layer has a double- or triple-layer structure comprising a layer containing a host substance alone as the light emitting material and a layer containing a dopant in addition to this host substance.

The light emitting layer has functions of injecting holes and electrons, transporting them, and recombining holes and electrons to create excitons. For the light emitting layer, it is preferable to use a relatively electronically neutral compound, so that the electrons and holes can be easily injected and transported in a well-balanced state.

In the light emitting layer structure, the layer formed of the host substance should preferably have a thickness of the order of 5 to 50 nm, and especially 10 to 20 nm although varying depending on a formation process. The dopant-containing layer sandwiched between the host substance-containing layers should preferably have a thickness of the order of 5 to 100 nm, and especially 20 to 80 nm. Then, the total thickness of the light emitting layer should preferably be of the order of 10 to 200 nm.

Depending on the fluorescence wavelength or emission wavelength of the light emitting substance, the dopant-containing layer may be located nearer to either the side of the inorganic insulting electron injecting and transporting layer or the side of the inorganic insulating hole injecting and transporting layer. In other words, the position of the dopant-containing layer vertical to the substrate can be aligned with a position optimized for the extraction of light in the light emitting layer structure depending on the emission wavelength. In this case, the thickness of the layer formed of the host substance should preferably be in the aforesaid range.

In the organic EL device according to the invention, the light emitting layer contains a fluorescent material that is a compound capable of emitting light. The fluorescent material used herein, for instance, may be at least one compound selected from compounds such as those disclosed in JP-A 63-264692, e.g., quinacridone, rubrene, and styryl dyes. Use may also be made of quinoline derivatives such as metal complex dyes containing 8-quinolinol or its derivative as ligands, for instance, tris(8-quinolinolato)aluminum, tetraphenylbutadiene, anthracene, perylene, coronene, and 12-phthaloperinone derivatives. Use may further be made of phenylanthracene derivatives disclosed in JP-A 8-12600 (Japanese Patent Application No. 6-110569) and tetraarylethene derivatives disclosed in JP-A 8-12969 (Japanese Patent Application No. 6-114456).

Preferably, the fluorescent compound is used in combination with a host substance capable of emitting light by itself; that is, it is preferable that the fluorescent compound is used as a dopant. In such a case, the content of the fluorescent compound in the light emitting layer is in the range of preferably 0.01 to 10% by weight, and especially 0.1 to 5% by weight. By using the fluorescent compound in combination with the host substance, it is possible to vary the wavelength performance of light emission, thereby making light emission possible on a longer wavelength side and, hence, improving the light emission efficiency and stability of the device.

Quinolinolato complexes, and aluminum complexes containing 8-quinolinol or its derivatives as ligands are preferred for the host substance. Such aluminum complexes are typically disclosed in JP-A's 63-264692, -255190, 5-70733, 5-258859, 6-215874, etc.

Exemplary aluminum complexes include tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato) gallium, bis(5-chloro-8-quinolinolato)calcium, 5,7-dichloro-8-quinolinolato-aluminum, tris(5,7-dibromo-8-hydroxyquinolinolato)aluminum, and poly[zinc(II)-bis(8-hydroxy-5-quinolinyl)methane].

Use may also be made of aluminum complexes containing other ligands in addition to 8-quinolinol or its derivatives, for instance, bis(2-methyl-8-quinolinolato)(phenolato) aluminum (III), bis(2-methyl-8-quinolinolato)(o-cresolato) aluminum (III), bis(2-methyl-8-quinolinolato)(m-cresolato) aluminum (III), bis(2-methyl-8-quinolinolato)(p-cresolato) aluminum (III), bis(2-methyl-8-quinolinolato)(o-phenylphenolato)aluminum (III), bis(2-methyl-8-quinolinolato) (m-phenylphenolato)aluminum (III), bis(2-methyl-8-quinolinolato) (p-phenylphenolato)aluminum (III), bis(2-methyl-8-quinolinolato)(2,3-dimethylphenolato)aluminum (III), bis(2-methyl-8-quinolinolato)(2,6-dimethylphenolato) aluminum (III), bis(2-methyl-8-quinolinolato)(3,4-dimethylphenolato)aluminum (III), bis(2-methyl-8-quinolinolato)(3,5-dimethylphenolato) aluminum (III), bis (2-methyl-8-quinolinolato)(3,5-di-tert-butylphenolato) aluminum (III), bis(2-methyl-8-quinolinolato) (2,6-diphenylphenolato)aluminum (III), bis(2-methyl-8-quinolinolato)(2,4,6-triphenylphenolato)aluminum (III), bis (2-methyl-8-quinolinolato)(2,3,6-trimethylphenolato) aluminum (III), bis(2-methyl-8-quinolinolato) (2,3,5,6-tetramethylphenolato)aluminum (III), bis(2-methyl-8-quinolinolato)(1-naphtholato)aluminum (III), bis(2-methyl-8-quinolinolato)(2-naphtholato)aluminum (III), bis(2,4-dimethyl-8-quinolinolato)(o-phenylphenolato)aluminum (III), bis(2,4-dimethyl-8-quinolinolato)(p-phenylphenolato) aluminum (III), bis(2,4-dimethyl-8-quinolinolato)(m-phenylphenolato) aluminum (III), bis(2,4-dimethyl-8-quinolinolato)(3,5-dimetbylphenolato)aluminum (III), bis (2,4-dimethyl-8-quinolinolato)(3,5-di-tert-butylphenolato) aluminum (III), bis(2-methyl-4-ethyl-8-quinolinolato)(p-cresolato)aluminum (III), bis(2-methyl-4-methoxy-8-quinolinolato)(p-phenyl-phenolato)aluminum (III), bis(2-methyl-5-cyano-8-quinolinolato)(o-cresolato)aluminum (III), and bis(2-methyl-6-trifluoromethyl-8-quinolinolato) (2-naphtholato)aluminum (III).

Besides, use may be made of bis(2-methyl-8-quinolinolato)aluminum (III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum (III)-$\mu$-oxo-bis (4-ethyl-2-methyl-8-quinolinolato)aluminum (III), bis(2-methyl-4-methoxyquinolinolato)aluminum (III)-$\mu$-oxo-bis (2-methyl-4-methoxyquinolinolato)aluminum (III), bis(5-cyano-2-methyl-8-quinolinolato)aluminum (III)-$\mu$-oxo-bis(5-cyano-2-methyl-8-quinolinolato)aluminum (III), bis(2-methyl-5-trifluoromethyl-8-quinolinolato) aluminum (III)-$\mu$-oxo-bis(2-methyl-5-trifluoromethyl-8-quinolinolato)aluminum (III), etc.

Other preferable host substances include phenylanthracene derivatives disclosed in JP-A 8-12600 (Japanese Patent Application No. 6-110569), tetraarylethene derivatives disclosed in JP-A 8-12969 (Japanese Patent Application No. 6-114456), etc.

In the practice of the invention, the light emitting layer may also serve as an electron transporting layer. In this case, it is preferable to use a fluorescent material, e.g., tris(8-quinolinolato)aluminum or the like, which may be provided by evaporation.

If necessary or preferably, the light emitting layer is formed of a mixed layer of at least one compound capable of injecting and transporting holes with at least one compound capable of injecting and transporting electrons. Preferably in this case, a dopant is incorporated in the mixed layer. The content of the dopant compound in the mixed layer is in the range of preferably 0.01 to 20% by weight, and especially 0.1 to 15% by weight.

In the mixed layer with a hopping conduction path available for carriers, each carrier migrates in the polarly prevailing substance, so making the injection of carriers having an opposite polarity unlikely to occur. This leads to an increase in the service life of the device due to less damage to the organic compound. By incorporating the aforesaid dopant in such a mixed layer, it is possible to vary the wavelength performance of light emission that the mixed layer itself possesses, thereby shifting the wavelength of light emission to a longer wavelength side and improving the intensity of light emission, and the stability of the device as well.

The compound capable of injecting and transporting holes and the compound capable of injecting and transporting electrons, both used to form the mixed layer, may be selected from compounds for the injection and transportation of holes and compounds for the injection and transportation of electrons, as will be described later. Especially for the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

For the compounds capable of injecting and transporting electrons, it is preferable to use metal complexes containing quinoline derivatives, especially 8-quinolinol or its derivatives as ligands, in particular, tris(8-quinolinolato) aluminum ($Alq^3$). It is also preferable to use the aforesaid phenylanthracene derivatives, and tetraarylethene derivatives.

For the compounds for the injection and transportation of holes, it is preferable to use amine derivatives having strong fluorescence, for instance, hole transporting compounds such as triphenyldiamine derivatives, styrylamine derivatives, and amine derivatives having an aromatic fused ring.

In this case, the ratio of mixing the compound capable of injecting and transporting holes with the compound capable of injecting and transporting electrons is determined while the carrier mobility and carrier density are taken into consideration. In general, however, it is preferred that the weight ratio between the compound capable of injecting and transporting holes and the compound capable of injecting and transporting electrons is of the order of 1/99 to 99/1, particularly 10/90 to 90/10, and more particularly 20/80 to 80/20.

The thickness of the mixed layer should preferably be equal to or greater than the thickness of a single molecular layer, and less than the thickness of the organic compound layer. More specifically, the mixed layer has a thickness of preferably 1 to 85 nm, especially 5 to 60 nm, and more especially 5 to 50 nm.

Preferably, the mixed layer is formed by co-evaporation where the selected compounds are evaporated from different evaporation sources. When the compounds to be mixed have identical or slightly different vapor pressures (evaporation temperatures), however, they may have previously been mixed together in the same evaporation boat for the subsequent evaporation. Preferably, the compounds are uniformly mixed together in the mixed layer. However, the compounds in an archipelagic form may be present in the mixed layer. The light emitting layer may generally be formed at a given thickness by the evaporation of the organic fluorescent substance or coating a dispersion of the organic fluorescent substance in a resin binder.

For the hole injecting and transporting layer, use may be made of various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (triaryldiamine or triphenyl-diamine (TPD)), aromatic tertiary amines, hydrazone derivatives, carbazole derivatives, triazole derivatives, imidazole derivatives, oxadiazole derivatives having an amino group, and polythiophenes. These compounds may be used singly or in combination of two or more. Where two or more such compounds are used, they may be stacked as separate layers, or otherwise mixed.

For the electron injecting and transporting layer, use may be made of quinoline derivatives such as organic metal complexes containing 8-quinolinol or its derivatives as ligands, for instance, tris(8-quinolinolato)aluminum ($Alq^3$), oxadiazole derivatives, perylene derivatives, pyridine derivatives, pyrimidine derivatives, quinoxaline derivative, diphenylquinone derivatives, and nitro-substituted fluorene derivatives. In the invention, the light emitting layer may also serve as an electron transporting layer. In this case, it is preferable to use tris(8-quinolilato)aluminum, etc.

Preferably, the light emitting layer is formed by a vacuum evaporation process because a uniform thin film can then be obtained. With the vacuum evaporation process, it is thus possible to obtain a uniform thin film in an amorphous state or with a grain size of up to 0.2 μm. A grain size of greater than 0.2 μm results in non-uniform light emission. To avoid this, it is required to make the driving voltage of the device high. However, this in turn gives rise to some considerable drop of hole injection efficiency.

No particular limitation is imposed on conditions for vacuum evaporationl. However, the vacuum evaporation should preferably be carried out at a degree of vacuum of up to $10^{-4}$ Pa and a deposition rate of about 0.01 to 1 nm/sec. Also, the layers should preferably be continuously formed in vacuo, partly because the deposition of impurities on the interface between adjacent layers is avoidable resulting in the achievement of high performance, and partly because the driving voltage of the device can be lowered with elimination of dark spots or no growth of dark spots.

When the layers, each containing a plurality of compounds, are formed by the vacuum evaporation process, it is preferable that co-evaporation is carried out while each boat with the compounds charged therein is placed under temperature control.

The inorganic insulating hole injecting and transporting layer has functions of facilitating injection of holes from the hole injecting electrode, providing stable transportation of holes and blocking electrons, and the inorganic insulating electron injecting and transporting layer has functions of facilitating injection of electrons from the cathode, providing stable transportation of electrons and blocking holes. These layers are effective for increasing the number of holes and electrons injected into the light emitting layer and confining holes and electrons therein for optimizing the recombination region to improve light emission efficiency.

If the inorganic insulating electron injecting and transporting layer is made up of the aforesaid main component or components, etc., it is then unnecessary to form a specially dedicated electrode having the function of injecting electrons; it is possible to use a metal electrode having relatively high stability and good conductivity. This improves the electron injection and transport efficiency of the inorganic insulating electron injecting and transporting layer, resulting in an increase in the service life of the device. If the oxide(s) that is the main components) of the inorganic insulating hole injecting and transporting layer is poor in oxygen, it is then possible to form oxygen depletion thereby injecting holes, with high efficiency, from the hole injecting electrode to the organic layer on the light emission side. In addition, it is possible to prevent migration of electrons from the organic layer to the hole injecting electrode, resulting in the high-efficiency recombination of holes and electrons in the light emitting layer.

As the main component, the inorganic insulating electron injecting and transporting layer comprises one or two or more of lithium oxide ($Li_2O$), rubidium oxide ($Rb_2O$), potassium oxide ($K_2O$), sodium oxide ($Na_2O$), cesium oxide ($Cs_2O$), strontium oxide (SrO), magnesium oxide (MgO) and calcium oxide (Cao). These oxides may be used alone or in combination of two or more. When two or more such oxides are used, their mixing ratio may be chosen as desired. Of these oxides, strontium oxide is most preferable. Next is magnesium oxide, then calcium oxide, and finally lithium oxide ($Li_2O$). Next is rubidium oxide ($Rb_2O$), then potassium oxide ($K_2O$), and finally sodium oxide ($Na_2O$). When these oxides are used in the form of a mixture, it is preferable that the mixture contains strontium oxide in an amount of 40 mol % or more, or lithium oxide and rubidium oxide in a total amount of 40 mol % or more, and especially 50 mol % or more.

Preferably, the inorganic insulating electron injecting and transporting layer should contain as a stabilizer silicon oxide ($SiO_2$) and/or germanium oxide ($GeO_2$). These oxide may be used alone or in an admixture form having a mixing ratio chosen as desired.

Usually, each oxide is present with its stoichiometric composition. However, it is acceptable that the oxide may deviate somewhat from this; it may be present with non-stoichiometric composition.

In the inorganic insulating electron injecting and transporting layer of the invention, the ratio of each constituent to all components should preferably be:

80 to 99 mol %, especially 90 to 95 mol % for the main components, and 1 to 20 mol %, especially 5 to 10 mol % for the stabilizer, as calculated in an SrO, MgO, CaO, $Li_2O$, $Rb_2O$, $K_2O$, $Na_2O$, $Cs_2O$, $SiO_2$, and $GeO_2$ basis.

The inorganic insulating electron injecting and transporting layer has a thickness of preferably 0.1 to 2 nm, and more preferably 0.3 to 0.8 nm.

The inorganic insulating hole injecting layer comprises as a main component an oxide of silicon and/or an oxide of germanium.

As measured according to Rutherford back-scattering, the average composition of the main component is represented by

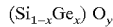

where $0 \leq x \leq 1$, and $1.7 \leq y < 1.99$.

By allowing the main component oxide of the inorganic insulating hole injecting and transporting layer to have a composition within the above-defined range, it is thus possible to inject, with high efficiency, holes from the hole injecting electrode into the organic layer on the light emission side. In addition, it is possible to prevent migration of electrons from the organic layer to the hole injecting electrode, resulting in high-efficiency recombination of holes and electrons in the light emitting layer. The inorganic insulating hole injection and transport layer, the object of which is only to inject and transport holes, gives out no light if reverse-biased. Accordingly, the organic EL device of the invention can be effectively applied to displays required to have high emission luminance, especially time-division driving displays. The organic EL device of the invention can take full advantage of both the merits of the inorganic material and the merits of the organic material. In addition, the organic EL device of the invention has a luminance equivalent to that of a prior art device comprising an organic hole injecting layer, and is improved in heat resistance and weather resistance over the prior art device, so that the service life of the device can be improved while the occurrence of leakage currents or dark spots is reduced. Device fabrication is also facilitated because inexpensive and easily available inorganic materials are used rather than relatively expensive organic materials, so that device fabrication costs can be cut down.

The letter y representing the content of oxygen should preferably be in the composition range as mentioned above or $1.7 \leq y \leq 1.99$. A deviation of y from this range is not preferable because there is a drop of hole injection capability, which in turn causes a luminance drop. More preferably, $1.85 \leq y \leq 1.98$.

The inorganic insulating hole injecting and transporting layer may be formed of either silicon oxide or germanium oxide, or alternatively a thin film comprising a mixture thereof. The letter x representing the composition ratio of these oxides is $0 \leq x \leq 1$, preferably $0 \leq x \leq 0.4$, more preferably $0 \leq x \leq 0.3$, and even more preferably $0 \leq x \leq 0.2$.

In another parlance, the ratio x should be preferably at least 0.6, more preferably at least 0.7, and even more at least preferably 0.8.

The above content of oxygen represents an average composition of oxygen in the film as found by Rutherford back-scattering. For this purpose, however, other measuring methods, too, may be used provided that they are equivalent in precision to that of the Rutherford back-scattering method.

Preferably, the inorganic insulting hole injecting and transporting layer should further contain at least one of Cu, Fe, Ni, Ru, Sn, and Au, among which Cu, Ni, and Sn are preferred with Ni being most preferred. The content of each element should be preferably up to 10 at %, more preferably 0.05 to 10 at %, even more preferably 0.1 to 10 at %, and especially 0.5 to 5 at %. At greater than the upper limit, the function of injecting holes becomes worse. When two or more such elements are used in combination, it is preferable that the total amount thereof is within the above range.

It is acceptable that the inorganic insulating hole injecting and transporting layer further contains as impurities Ne, Ar, Kr, Xe, etc. used for a sputtering gas in a total amount of the order of preferably up to 10 at %, more preferably 0.01 to 2 wt %, and even more preferably 0.05 to 1.5 wt %. The layer may contain one or two or more such elements. When two or more such elements are used, they may be mixed together at an arbitrary ratio.

These elements are used as the sputtering gas, and incorporated into the inorganic insulating hole injecting and transporting layer during film formation. The incorporation of too much elements renders it impossible to obtain any desired performance because the trap effect becomes extremely slender.

The content of the sputtering gas is determined by film formation pressure, the flow rate ratio between the sputtering gas and oxygen, film formation rate, etc., especially the film formation pressure. To allow the content of the sputtering gas to come within the above range, it is preferable that film formation is carried out on a high vacuum side, for instance, at up to 1 Pa, and especially 0.1 to 1 Pa.

It is here to be noted that the entire hole injecting layer may be non-uniform in composition provided that it has such a composition as mentioned above on average. For instance, the hole injecting layer may have a concentration gradient structure in the thickness direction. In this case, the interface between the hole injecting layer and the organic layer (light emitting layer) is poor in oxygen.

Normally, the inorganic insulating hole injecting and transporting layer is in a noncrystalline state.

Preferably but not exclusively, the inorganic insulating hole injecting and transporting layer should have a thickness of the order of 0.05 to 10 nm, and especially 1 to 5 nm. When the thickness of the hole injecting layer deviates from the range, no sufficient injection of holes is achievable.

The inorganic insulating electron injecting and transporting layer, and the inorganic insulating hole injecting and transporting layer may be fabricated by various physical or chemical thin-film formation processes such as a sputtering process, and an EB evaporation process, with the sputtering process being preferred.

When the inorganic insulating electron injecting and transporting layer, and the inorganic insulating hole injecting layer are formed by the sputtering process, it is preferable that the pressure of the sputtering gas during sputtering is in the range of 0.1 to 1 Pa. For the sputtering gas, inert gases used with an ordinary sputtering system, for instance, Ar, Ne, Xe, and Kr may be used. If required, $N_2$ may be used. Reactive sputtering, too, may be used with a sputtering atmosphere comprising a mixture of the sputtering gas with about 1 to 99% of $O_2$. A single- or multi-stage sputtering process may be performed using the aforesaid oxide or oxides for a target or targets.

For the sputtering process, an RF sputtering process using an RF power source, a DC reactive sputtering process, etc. may be used, with the RF sputtering process being most preferred. Power for a sputtering system is preferably in the range of 0.1 to 10 W/cm$^2$ for RF sputtering, and the film formation rate is preferably in the range of 0.5 to 10 nm/min., and especially 1 to 5 nm/min. During film formation, the substrate temperature is of the order of room temperature (25° C.) to 150° C.

Reactive sputtering may also be carried out with a reactive gas. For the reactive gas, $N_2$, $NH_3$, NO, $NO_2$, $N_2O$, etc. may be mentioned when nitrogen is used, and $CH_4$, $C_2H_2$, CO, etc. may be mentioned when carbon is used. These reactive gases may be used alone or in combination of two or more.

The organic EL device of the invention can be improved in terms of heat resistance and weather resistance and, hence, service life by the provision of the inorganic insulating hole injecting and transporting layer, and the inorganic insulating electron injecting and transporting layer. In addition, inexpensive and easily available inorganic materials rather than relatively expensive organic materials are used, so that device fabrication can be facilitated with a fabrication cost reduction. To add to this, there is an improvement in the connectability of the inorganic insulating layer to an inorganic material electrode, which becomes a problem in the prior art. It is thus possible to reduce the occurrence of leakage currents or dark spots.

A cathode is located on the inorganic insulating electron injecting and transporting layer (that faces away from the light emitting layer: below the inorganic insulating electron injecting and transporting layer in a so-called reverse multilayer arrangement). For the cathode, an ordinary metal rather than a special metal may be used because when used in combination with the following inorganic insulating electron injecting and transporting layer, it is not required to have electron injection capability with a low work function. Especially in view of conductivity and ease of handling, it is preferable to use one or two metal elements selected from the group of Al, Ag, In, Ti, Cu, Au, Mo, W, Pt, Pd, and Ni, and especially Al, and Ag.

The cathode thin film may have at least a certain thickness enough to impart electrons to the inorganic insulating electron injecting and transporting layer or a thickness of at least 50 nm, and preferably at least 100 nm. Although there is no particular upper limit to the cathode thickness, the cathode may usually have a thickness of the order of 50 to 500 nm. It is here to be noted that when emitted light is taken out of the cathode side, the cathode has preferably a thickness of the order of 50 to 300 nm.

When the organic EL device of the invention is fabricated in combination with the following inorganic insulating electron injecting and transporting layer, it is preferable to use the above metal element or elements for the cathode. If required, however, it is acceptable to use the following metals. For instance, mention may be made of pure metal elements such as K, Li, Na, Mg, La, Ce, Ca, Sr, Ba, Sn, Zn, and Zr, and a binary or ternary alloy system containing these metals and serving as a stability improver, for instance, Ag.Mg (Ag: 0.1 to 50 at %), Al.Li (Li: 0.01 to 14 at %), In.Mg (Mg: 50 to 80 at %), and Al.Ca (Ca: 0.01 to 20 at %).

The cathode thin film should preferably have at least a certain thickness enough for electron injection or a thickness of at least 0.1 nm, preferably at least 0.5 nm, and especially at least 1 nm. Although there is no particular upper limit to the film thickness, the cathode should usually have a thickness of the order of 1 to 500 nm. Additionally, an auxiliary electrode (protective electrode) may be located on the cathode.

The auxiliary electrode should preferably have at least a certain thickness enough to ensure electron injection efficiency and prevent entrance of moisture, oxygen or organic solvents or a thickness of preferably at least 50 nm, more preferably at least 100 nm, and even more preferably 100 to 500 nm. With too thin an auxiliary electrode, neither is its own effect obtainable, nor is sufficient connection with terminal electrodes obtainable because the ability of the auxiliary electrode to cover steps becomes low. When the auxiliary electrode is too thick, on the other hand, the growth rate of dark spots becomes high because of an increase in the stress of the auxiliary electrode.

The auxiliary electrode should preferably be formed of the optimum material chosen depending on the cathode material used in combination therewith. For instance, a low-resistance metal such as Al may be used if importance is put on electron injection efficiency, and a metal compound such as TiN may be used if emphasis is placed on sealability.

Preferably but not exclusively, the total thickness of the cathode plus the auxiliary electrode is usually of the order of 50 to 500 nm.

The hole injecting electrode should preferably be primarily composed of a material that can inject holes in the hole injecting layer with high efficiency and has a work function of 4.5 eV to 5.5 eV, for instance, any one of tin-doped indium oxide (ITO), zinc-doped indium oxide (IZO), indium oxide ($In_2O_3$), tin oxide ($SnO_2$), and zinc oxide (ZnO). It is here to be noted that these oxides may deviate somewhat from their stoichiometric compositions. Regarding ITO, it is desired that the mixing ratio of $SnO_2$ with respect to $In_2O_3$ be in the range of 1 to 20 wt %, and especially 5 to 12 wt %. Regarding IZO, the mixing ratio of ZnO with respect to $In_2O_3$ is usually in the range of about 12 to 32 wt %.

The hole injecting electrode may further contain silicon oxide ($SiO_2$) for work function control. The content of silicon oxide ($SiO_2$) should preferably be of the order of 0.5 to 10% in terms of the molar ratio of $SiO_2$ to ITO. The incorporation of $SiO_2$ contributes to an increase in the work function of ITO.

The electrode on the side out of which light is taken should preferably have a light transmittance of at least 50%, especially at least 60%, and more especially at least 70% with respect to light emitted at an emission wavelength of usually 400 to 700 nm. With decreasing transmittance, the light emitted from the light emitting layer attenuates, and so it is difficult to obtain the luminance needed for a light emitting device.

The electrode should preferably have a thickness of 50 to 500 nm, and especially 50 to 300 nm. Although there is no particular upper limit to the electrode thickness, too thick an electrode gives rise to concerns such as a transmittance drop, and defoliation. Too thin an electrode fails to obtain sufficient effect, and offers a problem in conjunction with film thickness, etc. during device fabrication.

Figure 2:
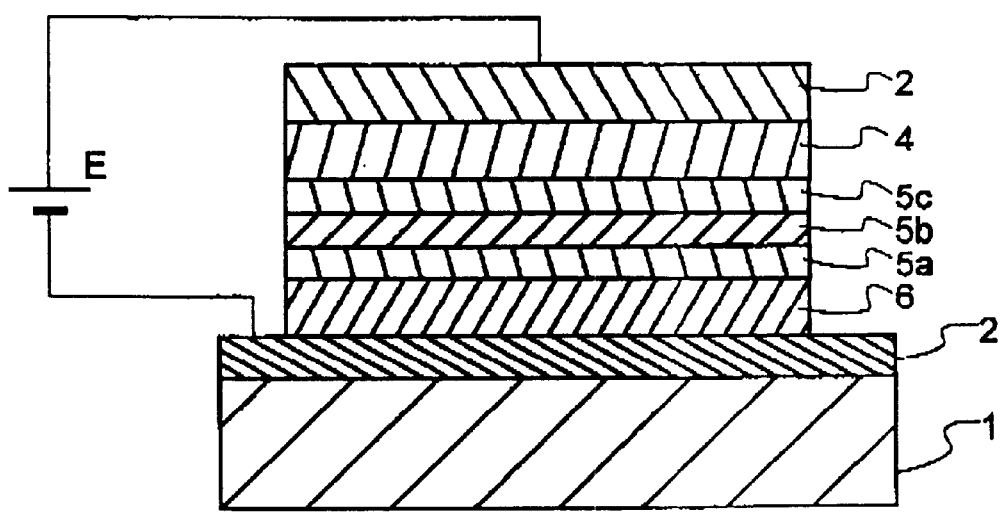
FIG. 2 is a sectional schematic of another embodiment of the organic EL device according to the invention.
Figure 3:
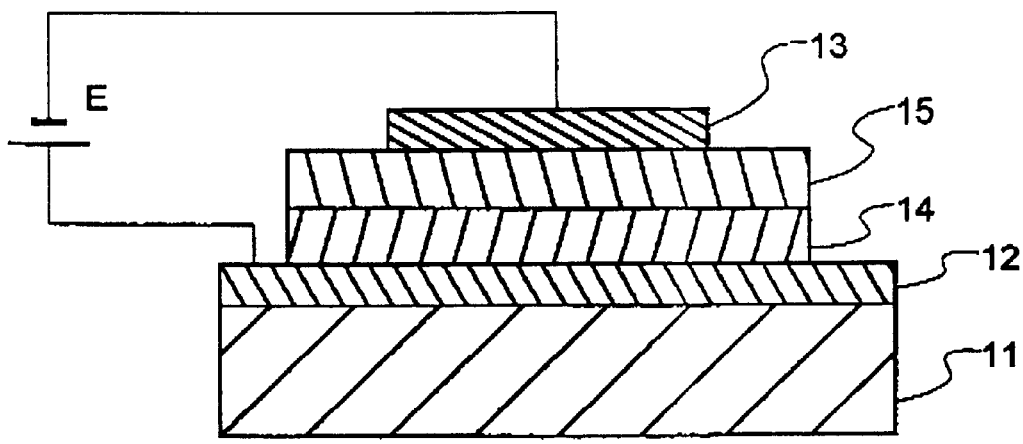
FIG. 3 is a sectional schematic of one exemplary arrangement of a prior art organic EL device.
Figure 4:
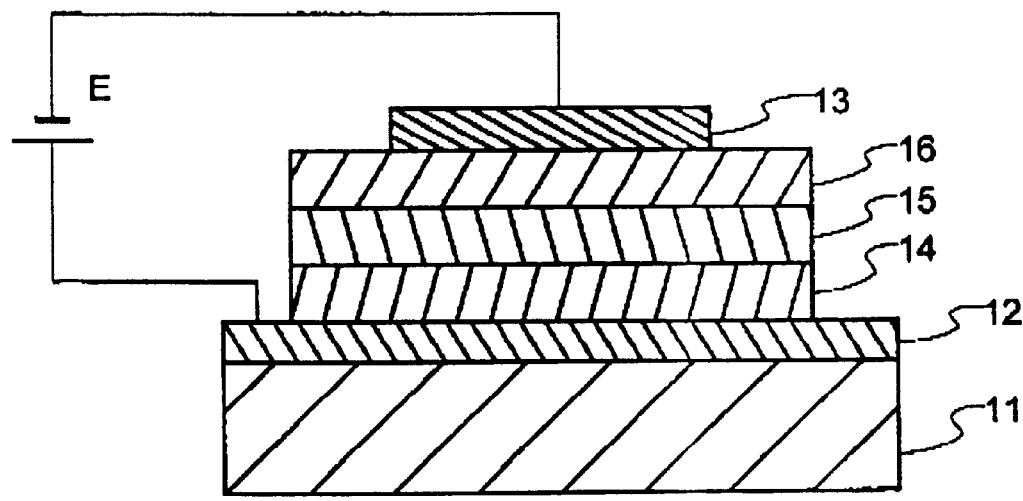
FIG. 4 is a sectional schematic of another exemplary arrangement of the prior art organic EL device.

As typically shown in FIG. 1, one embodiment of the organic EL device of the invention comprises, in order from a substrate 1, a hole injecting electrode 2, an inorganic insulating hole injecting and transporting layer 4, a layer 5a formed of a first host substance, a dopant-containing layer 5b, a layer 5c formed of a second host substance, an inorganic insulating electron injecting and transporting layer 6 and a cathode 3, which are laminated together on the substrate 1. As shown in FIG. 2, another embodiment of the organic EL device of the invention comprises, in order from a substrate 1, a cathode 3, an inorganic insulating electron injecting and transporting layer 6, a layer 5a formed of a first host substance, a dopant-containing layer 5b, a layer 5c formed of a second host substance, an inorganic insulating hole injecting and transporting layer 4 and a hole injecting electrode 2, which are laminated together on the substrate 1 in the reverse order. From these embodiments, either one of the layer 5a formed of the first host substance and the layer 5c formed of the second host substance may be omitted. In FIGS. 1 and 2, a driving power source E is connected between the hole injecting electrode 2 and the cathode 3.

The optimum structure may be chosen from these multilayer structures depending on the performance of the device demanded or what purpose the device is used for, and suitable modifications may be made thereto if required.

Preferably, the device is sealed up by means of a sealing sheet, etc. for the purpose of preventing oxidation of the organic layers and electrodes in the device. To prevent penetration of moisture, the sealing sheet is bonded to the device using an adhesive resin layer to seal up the device. An inert gas such as Ar, He, and $N_2$ is preferably used as a sealing gas. Then, the sealing gas should preferably have a moisture content of up to 100 ppm, especially up to 10 ppm, and more especially up to 1 ppm. Although there is no particular lower limit to the moisture content, the sealing gas should usually have a moisture content of about 0.1 ppm.

The sealing sheet, preferably in a flat sheet form, may be made of transparent or translucent materials such as glasses, quartz, and resins, among which the glasses are preferred. For such glass materials, alkali glass is preferable from a cost standpoint. Other preferable glass materials, for instance, include soda lime glass, lead alkali glass, borosilicate glass, aluminosilicate glass, and silica glass. In particular, a soda glass material subjected to no surface treatment is inexpensive and so is preferable. A metal sheet, a plastic sheet, etc., too, may be used in place of the sealing glass sheet.

For height control, a spacer is used to keep the sealing sheet at a height as desired. The spacer material may be resin beads, silica beads, glass beads, glass fibers, etc., with the glass beads being most preferred. The spacer is usually in a particulate form having a uniform particle size. In the invention, however, a spacer of any desired shape may be used provided that it can function well. The spacer size should preferably be 1 to 20 $\mu$m, more preferably 1 to 10 $\mu$m, and even more preferably 2 to 8 $\mu$m as calculated on a circle diameter basis. A spacer having such a diameter should preferably have a particle length of up to about 100 $\mu$m. Although there is no particular lower limit to the particle size, the particle size should usually be equal to or larger than the diameter.

The spacer may or may not be used when a recess is provided in the sealing sheet. When the spacer is used, its size is preferably within the aforesaid range, and more preferably within the range of 2 to 8 $\mu$m.

The spacer may have been incorporated in the sealing adhesive agent or may be incorporated in the sealing adhesive agent at the time of bonding. The content of the spacer in the sealing adhesive agent should be preferably 0.01 to 30 wt %, and more preferably 0.1 to 5 wt %.

For the adhesive agent, it is preferable to use a cation curing epoxy resin of the ultraviolet curing type, although an adhesive agent of the type that ensures stable adhesion strength and good airtightness may be used.

For the substrate on which an organic EL structure is formed according to the invention, a noncrystalline substrate such as a glass or quartz substrate, and a crystalline substrate such as an Si, GaAs, ZnSe, ZnS, GaP or InP substrate may be used. The crystalline substrate may also be provided with a crystalline or noncrystalline buffer layer or a metal buffer layer. For a metal substrate, Mo, Al, Pt, Ir, Au, Pd, and other metal substrates may be used. However, it is preferable to use a glass substrate. The substrate is usually located on the side out of which light is taken, and so it should preferably be transparent to light as in the above electrodes.

In the invention, a number of devices may be arranged on a plane. A color display may be constructed by changing the colors of light emitted from the devices arranged on the plane.

The substrate may be provided with a color filter film, fluorescent material-containing color conversion film or dielectric reflecting film for controlling the color of light emission.

For the color filter film, a color filter employed with liquid crystal display devices, etc. may be used. However, it is preferable to control the properties of the color filter in conformity to the light emitted from the organic EL device, thereby optimizing the efficiency of taking out light emission and color purity.

By using a color filter capable of cutting off extraneous light of such short wavelength as absorbed by the EL device material or the fluorescent conversion layer, it is possible to improve the light resistance of the device and the contrast of what is displayed on the device.

Instead of the color filter, an optical thin film such as a dielectric multilayer film may be used.

The fluorescent color conversion film absorbs light emitted from an EL device and gives out light from the phosphors contained therein for the color conversion of light emission, and is composed of three components, a binder, a fluorescent material and a light absorbing material.

In the practice of the invention, it is basically preferable to use a fluorescent material having high fluorescent quantum efficiency, and especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. It is also preferable to use a material that is not damaged during ITO or IZO film formation.

The light absorbing material is used when light is not fully absorbed by the fluorescent material, and so may be dispensed with, if not required. For the light absorbing material, it is preferable to make a selection from materials that do not extinguish fluorescence.

The organic EL device of the invention is generally of the DC drive type while it may be of the AC or pulse drive type. The applied voltage is generally of the order of 2 to 30 volts.

EXAMPLE

The present invention is explained more specifically with reference to some examples.

Example 1

A 7059 substrate (made by Corning) used as a glass substrate was scrubbed with neutral detergent. Then, the substrate was fixed to a substrate holder in a sputtering system, where an ITO hole injecting electrode layer was formed by a DC magnetron sputtering process using an ITO oxide target.

The substrate with the ITO film formed on it was ultrasonically washed with neutral detergent, acetone, and ethanol, and then pulled up from boiling ethanol, followed by drying. The substrate was subsequently cleaned on its surface with $UV/O_3$. Then, the substrate was fixed to the substrate holder in the sputtering system, which was evacuated to a vacuum of $1 \times 10^{-4}$ Pa or lower.

Then, a 1-nm thick inorganic insulating hole injecting and transporting layer was formed using $SiO_2$ for a target. The sputtering gas used comprised Ar mixed with 5% of $O_2$. The substrate temperature, film formation rate, operating pressure, and input power were 25° C., 1 nm/min., 0.5 Pa, and 5 W/cm², respectively. The formed hole injecting layer had a composition of $SiO_{1.9}$.

With the vacuum still kept, tris(8-quinolinolato) aluminum ($Alq^3$) was deposited by evaporation at a deposition rate of 0.2 nm/sec. to a thickness of 40 nm, thereby forming a layer formed of the host substance (light emitting layer).

With the vacuum still kept, tris(8-quinolinolato) aluminum ($Alq^3$) doped with 5 vol % of rubrene was deposited by evaporation at an overall deposition rate of 0.2 nm/sec. to a thickness of 40 nm, thereby forming a dopant-containing layer (light emitting layer).

With the vacuum still kept, tris(8-quinolinolato) aluminum ($Alq^3$) was deposited by evaporation at a deposition rate of 0.2 nm/sec. to a thickness of 40 nm, thereby forming a layer formed of the host substance (light emitting layer).

With the vacuum still maintained, this EL structure was transferred to a sputtering system where a 0.8-nm thick inorganic insulating electron injecting and transporting layer was formed using a target obtained by mixing together the target materials strontium oxide (SrO), lithium oxide ($Li_2O$) and silicon oxide ($SiO_2$) in such a manner that SrO was 80 mol % with respect to all components, $Li_2O$ was 10 mol % with respect to all components and $SiO_2$ was 10 mol % with all components. Referring to film formation conditions at this time, the substrate temperature was 25° C., the sputtering gas was Ar, the film formation rate was 1 nm/min., the operating pressure was 0.5 Pa, and the input power was 5 W/cM². In this case, the inorganic insulating electron injecting and transporting layer was first formed to a thickness of 0.4 nm while 100% Ar was fed at 100 SCCM, and the inorganic insulating electron injecting and transporting layer was then formed to a thickness of 0.4 nm while Ar and $O_2$ at 1:1 were fed at 100 SCCM.

With the vacuum still kept, Al was deposited by evaporation to a thickness of 20 nm, thereby forming a cathode.

Finally, the EL structure was sealed up by glass to obtain an organic EL device. A comparative organic EL device sample was obtained as in Example 1 with the exception that the light emitting layer was not constructed with a triple-layer structure; tris(8-quinolinolato)aluminum ($Alq^3$) doped with 5 vol % of rubrene was deposited by evaporation at an overall deposition rate of 0.2 nm/sec. to a thickness of 40 nm, thereby forming a light emitting layer.

Each sample was subjected to accelerated testing while a constant current of 100 mA/cm² was applied thereto, thereby examining its life performance. The luminance half-life of the comparative example constructed in the same manner as in Example 1 with the exception that the light emitting layer was constructed in a single-layer form was 100 hours or less whereas the half-life of the inventive sample was 150 hours or longer.

Example 2

Experiments were carried out as in Example 1 with the exception that the main component and stabilizer in the inorganic insulating electron injecting and transporting layer were changed from SrO to MgO, CaO or an oxide mixture thereof, from $Li_2O$ to $K_2O$, $Rb_2O$, $K_2O$, $Na_2O$, $Cs_2O$ or an oxide mixture thereof, and from $SiO_2$ to $GeO_2$ or an $SiO_2$ and $GeO_2$ oxide mixture. The obtained results were much the same as Example 1. The same was also true of when the cathode constituting material was changed from Al to Ag, In, Ti, Cu, Au, Mo, W, Pt, Pd, Ni or an alloy thereof.

Example 3

An organic EL device was prepared and estimated for life performance as in Example 1 with the exception that an inorganic insulating hole injecting and transporting layer having a composition of $SiO_{1.9}$ was formed using a target having a composition of $SiO_2$ and varying the flow rate of $O_2$ in the sputtering gas to an $O_2$ to Ar mixing ratio of 5%. The obtained results were much the same as Example 1.

Organic EL devices were prepared and estimated as in Example 1 with the exception that a layer having an $SiO_{1.95}$ composition was formed using a target having an $SiO_2$ composition and varying the flow rate of $O_2$ in the sputtering gas to an $O_2$ to Ar mixing ratio of 30%, a layer having a $GeO_{1.96}$ composition was formed using a target having a $GeO_2$ composition and varying the flow rate of $O_2$ in the sputtering gas to an $O_2$ to Ar mixing ratio of 30%, and a layer having an $Si_{0.5}Ge_{0.5}O_{1.92}$ composition was formed using a target having an $Si_{0.5}Ge_{0.5}O_2$ composition and varying the flow rate of $O_2$ in the sputtering gas to an $O_2$ to Ar mixing ratio of 10%. The obtained results were much the same as in Example 1.

Example 4

An organic EL device was prepared and estimated as in Example 1. However, the inorganic insulating hole injecting and transporting layer was formed to a thickness of 1 nm using as a target $SiO_2$ with 3 at % of Ni added thereto. In this case, the sputtering gas was Ar of 50 sccm and $O_2$ of 5 sccm, the substrate temperature was 25° C., the film formation rate was 1 m/min., the operating pressure was 0.5 Pa, and the input power was 5 W/cm². The thus formed inorganic insulating hole injecting and transporting layer had a composition of $SiO_{1.9}$ with 2.5 at % of Ni added thereto. The obtained results were much the same as in Example 1.

The same was also true of when the composition of the inorganic insulating hole injecting and transporting layer was changed from $SiO_{1.9}$ with 2.5 at % of Ni added thereto to $GeO_{1.9}$ with 2.5 at % of Ni added thereto, and $Si_{0.5}Ge_{0.5}O_{1.98}$ with 2.5 at % of Ni added thereto.

Even when the same amount of Sn, and Cu was used in place of Ni, a substantially similar life was obtained. This was also true of when Fe, Ru, and Au were used instead of Ni.

EFFECT OF THE INVENTION

According to the invention as explained above, it is possible to achieve an organic EL device which is resistant to a deterioration of an inorganic-organic interface, has performance equivalent or superior to that of a prior art device comprising hole and electron injecting and transporting layers using an organic substance, possesses an extended life, weather resistance and high stability, and is inexpensive.

What we claim is:

1. An organic EL device comprising a substrate, a hole injecting electrode and a cathode formed on said substrate, and an organic substance-containing light emitting layer located at least between said electrodes, wherein:

an inorganic insulating electron injecting and transporting layer is located between said light emitting layer and said cathode, an inorganic insulating hole injecting and transporting layer is located between said light emitting layer and said hole injecting electrode, said inorganic insulating electron injecting and transporting layer comprises as a main component one or two or more oxides selected from the group consisting of strontium oxide, magnesium oxide, calcium oxide, lithium oxide, rubidium oxide, potassium oxide, sodium oxide and cesium oxide, said inorganic insulating hole injecting and transporting layer comprises as a main component an oxide of silicon and/or an oxide of germanium, said main component having an average composition represented by $(Si_{1-x}Ge_x)O_y$ where $0 \leq x \leq 1$, and $1.7 \leq y \leq 1.99$, said light emitting layer comprises a layer made up of a host substance on a side thereof contiguous to said inorganic insulating electron injecting and transporting layer and/or said inorganic insulating hole injecting and transporting layer, and at least a part of said layer made up of said host substance comprises a layer containing a dopant in addition to said host substance.

2. The organic EL device according to claim 1, wherein said light emitting layer has a thickness given by a thickness of said layer made up of said host substance that is 5 to 50 nm and a thickness of said dopant-containing layer that is 5 to 100 nm.

3. The organic EL device according to claim 1, wherein said inorganic insulating hole injecting and transporting layer further comprises as a stabilizer silicon oxide and/or germanium oxide.

4. The organic EL device according to claim 1, wherein said cathode is formed of one or two or more metal elements selected from the group consisting of Al, Ag, In, Ti, Cu, Au, Mo, W, Pt, Pd, and Ni.

5. The organic EL device according to claim 1, wherein said inorganic insulating hole injecting layer contains at least one of Cu, Fe, Ni, Ru, Sn, and Au in an amount of up to 10 at %.

6. The organic EL device according to claim 2, wherein in said inorganic insulating electron injecting and transporting layer, the ratio of each constituent to all components is:
   80 to 99 mol % for said main component, and 1 to 20 mol % for said stabilizer.

7. The organic EL device according to claim 1, wherein said inorganic insulating electron injecting and transporting layer has a thickness of 0.1 to 2 nm.

8. The organic EL device according to claim 1, wherein said inorganic insulating hole injecting and transporting layer has a thickness of 0.1 to 5 nm.

* * * * *

UNITED STATES PATENT AND TRADEMARK OFFICE
CERTIFICATE OF CORRECTION

PATENT NO. : 6,166,488
DATED : December 26, 2000
INVENTOR(S) : Michio Arai

It is certified that error appears in the above-identified patent and that said Letters Patent is hereby corrected as shown below:

Column 18,
Line 32, "claim 2" should read -- claim 3 --.

Signed and Sealed this

Fifteenth Day of January, 2002

Attest:

JAMES E. ROGAN
Director of the United States Patent and Trademark Office

Attesting Officer